(12) United States Patent
Chen (10) Patent No.: US 11,698,297 B2
(45) Date of Patent: Jul. 11, 2023

(54) METHODS AND DEVICES FOR DETECTING AMBIENT LIGHT BASED ON DIFFERENT STATES OF FLEXIBLE SCREEN, AND STORAGE MEDIUM

(71) Applicant: BEIJING XIAOMI MOBILE SOFTWARE CO., LTD., Beijing (CN)

(72) Inventor: Chaoxi Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 312 days.

(21) Appl. No.: 17/020,733

(22) Filed: Sep. 14, 2020

(65) Prior Publication Data
US 2021/0325242 A1    Oct. 21, 2021

(30) Foreign Application Priority Data

Apr. 21, 2020 (CN) .......................... 202010318306.7

(51) Int. Cl.
*G01J 1/42* (2006.01)
*G01J 1/02* (2006.01)
(Continued)

(52) U.S. Cl.
CPC ........... *G01J 1/4204* (2013.01); *G01J 1/0271* (2013.01); *G06F 1/1647* (2013.01);
(Continued)

(58) Field of Classification Search
CPC .......... G01J 1/4204; G01J 1/0271; G01J 3/00; G01J 3/0264; G06F 1/1652; G06F 1/1677;
(Continued)

(56) References Cited

U.S. PATENT DOCUMENTS

D918,885 S      5/2021   Kim et al.
2014/0375219 A1  12/2014  Lee et al.
(Continued)

FOREIGN PATENT DOCUMENTS

CN    105324807 A    2/2016
CN    107547734 A    1/2018
(Continued)

OTHER PUBLICATIONS

Extended European Search Report in the European Application No. 20198535.5, dated Jul. 14, 2021, (10p).

*Primary Examiner* — Jennifer D Bennett
*Assistant Examiner* — Erin R Garber
(74) *Attorney, Agent, or Firm* — Arch & Lake LLP (57) ABSTRACT

The present disclosure relates to a method and device for detecting ambient light, an electronic device and a storage medium. The electronic device includes: a first screen, the first screen being a foldable flexible screen; multiple light sensors, orientations of light sensing surfaces of the multiple light sensors being different; and at least one processor electronically connected with the first screen and the light sensors respectively and configured to select a target light sensor from the multiple light sensors according to a present state of the first screen and obtain target detection data representing present ambient brightness according to detection data of the target light sensor.

15 Claims, 6 Drawing Sheets

(51) Int. Cl.
*G06F 1/16* (2006.01)
*H05K 5/00* (2006.01)
*H04M 1/02* (2006.01)
*H04M 1/72454* (2021.01)
*G09G 3/36* (2006.01)
*G06F 3/041* (2006.01)

(52) U.S. Cl.
CPC .......... *G06F 1/1652* (2013.01); *G06F 1/1677* (2013.01); *H04M 1/0214* (2013.01); *H04M 1/0241* (2013.01); *H04M 1/0268* (2013.01); *H05K 5/0017* (2013.01); *G06F 1/1684* (2013.01); *G06F 3/0416* (2013.01); *G09G 3/36* (2013.01); *G09G 2320/0626* (2013.01); *H04M 1/72454* (2021.01); *H05K 2201/05* (2013.01)

(58) Field of Classification Search
CPC .... G06F 1/1647; G06F 1/1684; G06F 3/0416; G06F 1/1616; G06F 3/0412; G06F 2203/04803; G06F 3/04845; G06F 2203/04102; G06F 1/1643; G06F 1/1626; G06F 3/0428; H05K 5/0017; H05K 2201/05; H04M 1/0241; H04M 1/0268; H04M 1/72454; H04M 1/0214; H04M 1/0245; H04M 1/0216; G09G 3/36; G09G 2320/0626; G09G 3/035; G09G 2380/02; G09G 2360/144; G09G 2356/00; G09G 2340/0464

See application file for complete search history.

(56) References Cited

U.S. PATENT DOCUMENTS

| | | | |
|---|---|---|---|
| 2016/0012797 | A1 | 1/2016 | Lee et al. |
| 2016/0301832 | A1 | 10/2016 | Xu |
| 2017/0200411 | A1* | 7/2017 | Song .................. H01L 27/3227 |
| 2017/0344255 | A1* | 11/2017 | Xie .................... H04M 1/72454 |
| 2020/0280006 | A1* | 9/2020 | Sun ........................ G06F 1/1641 |
| 2021/0201720 | A1* | 7/2021 | Zhu ......................... G06F 3/147 |
| 2021/0344783 | A1* | 11/2021 | Jeong .................... H01Q 1/243 |

FOREIGN PATENT DOCUMENTS

| | | |
|---|---|---|
| CN | 107665698 A | 2/2018 |
| CN | 108766362 A | 11/2018 |
| CN | 208424468 U | 1/2019 |
| CN | 109817152 A | 5/2019 |
| CN | 109992189 A | 7/2019 |
| EP | 3826276 A1 | 5/2021 |
| JP | 1643845 S | 10/2019 |
| WO | 2014204047 A1 | 12/2014 |
| WO | 2020045786 A1 | 3/2020 |

\* cited by examiner

METHODS AND DEVICES FOR DETECTING AMBIENT LIGHT BASED ON DIFFERENT STATES OF FLEXIBLE SCREEN, AND STORAGE MEDIUM

CROSS-REFERENCE TO RELATED APPLICATION

This application is based upon and claims priority to Chinese Patent Application No. 202010318306.7, filed on Apr. 21, 2020, the entire content of which is incorporated herein by reference.

TECHNICAL FIELD

The present disclosure generally relates to the technical field of electronics, and more particularly, to a method and device for detecting ambient light, an electronic device, and a storage medium.

BACKGROUND

An electronic device with a display screen is usually provided with a light sensor which is configured to detect ambient brightness above the display screen, such that display brightness of the display screen may be adjusted according to the ambient brightness. An electronic device with a foldable flexible screen may be used under multiple states including unfolded, folded and other states. Under different states, it is difficult for the light sensor to accurately detect ambient brightness of an ambient where an electronic device is located, and consequently, display brightness of a display screen cannot be adjusted accurately, thereby reducing user experiences.

SUMMARY

According to a first aspect of the present disclosure, an electronic device is provided, which may include: a first screen, multiple light sensors, and a processing component. The first screen may be a foldable flexible screen. Orientations of light sensing surfaces of the multiple light sensors may be different. The processing component may be electronically connected with the first screen and the light sensors respectively, and configured to select a target light sensor from the multiple light sensors according to a present state of the first screen and obtain target detection data representing present ambient brightness according to detection data of the target light sensor.

According to a second aspect of the present disclosure, a method for detecting ambient light is provided, which may be applied to the electronic device in any abovementioned embodiment and include that: a present state of a first screen of the electronic device is acquired; a target light sensor is selected from multiple light sensors; and target detection data representing present ambient brightness is obtained according to detection data of the target light sensor.

According to a third aspect of the present disclosure, a device for detecting ambient light is provided, which may at least include a processor and a memory configured to store executable instructions run in the processor. The processor is configured to run the executable instructions to execute the steps in any method for detecting ambient light.

According to a fourth aspect of the present disclosure, a non-transitory computer-readable storage medium is provided, in which computer-executable instructions are stored, the computer-executable instructions being executed by a processor to implement the steps in any method for detecting ambient light.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Figure 1:
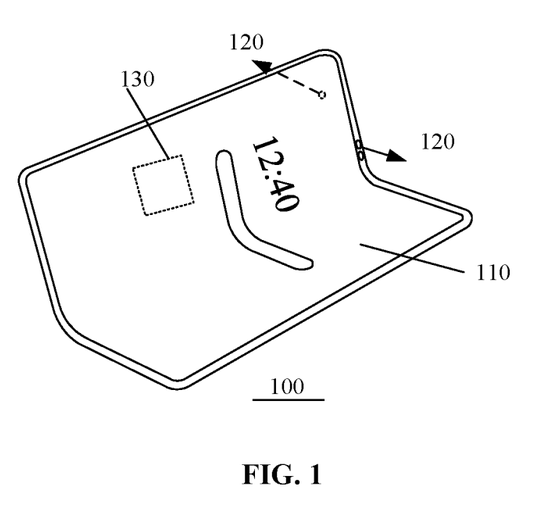
FIG. 1 is a first structure diagram of an electronic device, according to an exemplary embodiment.

FIG. 1 is a structure diagram of an electronic device, according to an exemplary embodiment. As illustrated in FIG. 1, an electronic device 100 includes: a first screen 110, multiple light sensors 120, and a processing module 130.

The first screen includes a foldable flexible screen.

Orientations of light sensing surfaces of the multiple light sensors are different.

The processing module 130 is electronically connected/coupled respectively with the first screen and the light sensors, and is configured to select a target light sensor from the multiple light sensors according to a present state of the first screen and to obtain target detection data representing present ambient brightness according to detection data of the target light sensor. In one example, the processing module 130 may select the target sensor that is not shielded or blocked by the electronic device 100 according to a present state of the first screen. Accordingly, the target light sensor provides an accurate ambient brightness to the processing module 130.

In the embodiments of the present disclosure, the electronic device may be a mobile phone, a tablet computer, an electronic reader or another wearable electronic device, etc. The electronic device at least comprises a display screen, i.e., a first screen as above. The first screen is a foldable flexible screen. The first screen may be a full screen covering a surface of the electronic device, and may also be a surrounding screen, waterfall screen, or the like, enclosing multiple surfaces of the electronic device. Since the first screen is foldable, a morphological structure of the electronic device may also change along with a folded state of the first screen. For example, the first screen in an unfolded state is shaped into a plane, and the electronic device is also in the unfolded state.

The first screen is bent by a certain angle, such that the electronic device appears like an opened book. The first screen is folded, such that the electronic device appears like a closed book, and in such case, a display surface of the first screen is hidden inside.

In the embodiments of the present disclosure, the multiple light sensors are arranged on the electronic device and may be arranged on different surfaces of the electronic device. The light sensing surface of the light sensor is a sensor surface configured to receive a light signal, and the orientation of the light sensing surface determines a direction where detected ambient light is from. Herein, the light sensing surfaces of different light sensors face different directions, such that ambient light in different directions of the electronic device may be detected.

In some embodiments, when the electronic device is used, it is usually necessary to adjust a display brightness level of the display screen according to ambient brightness above the display screen, or the ambient brightness above the display screen is determined as a parameter of another application. However, since the electronic device with the foldable flexible screen has different states, the first screen is not always in a state of completely facing a user. In addition, under different states of the flexible screen, the light sensors at some positions may be shielded by the electronic device, thereby reducing the detection accuracy. Detecting ambient brightness above the first screen only through the light sensor on a surface where the first screen is located may not meet requirements of such the electronic device. Therefore, in the embodiments of the present disclosure, the light sensor that is not shielded is selected as the target light sensor according to the state of the first screen to improve the detection accuracy.

In addition, in some specific scenarios, besides the ambient brightness above the display screen, ambient brightness in another direction may also influence a visual effect of the display screen. For example, during use at night, if there is a light source emitting light upwards such as a floor lamp on the ground, the user may not view the display screen clearly. Therefore, it is also necessary to adjust the display brightness level of the display screen according to ambient light from a back surface of the display screen.

In one or more embodiments of the present disclosure, the light sensors in multiple directions are adopted, such that the electronic device may be adapted to different scenarios and requirements as well as different states of the first screen, so as to acquire brightness data of the ambient light in all directions. Then, through the processing module, the target detection data configured to represent the present ambient brightness is selected from alternative detection data detected by the multiple light sensors based on a predetermined algorithm or condition, thereby providing a proper ambient brightness parameter for adjustment of the display brightness level and another application, etc.

Through the technical solution in the embodiments of the present disclosure, the multiple light sensors facing different directions are arranged at different positions of the electronic device, such that light in different directions in an environment where the electronic device is located may be detected, and the flexibility in ambient light detection is improved. In addition, with adoption of the solution, the electronic device may select detection data of different light sensors as the target detection data when the flexible screen is in different states, such that the accuracy of ambient light detection under different states is improved.

In some embodiments, at least one light sensor is on the same surface with the first screen, and the orientations of the light sensing surface of the at least one light sensor and a display surface of the first screen in an unfolded state are the same, and the first screen in the unfolded state is unfolded to a plane.

Since the first screen may be used in a main application scenario of the electronic device and the first screen is unfolded to display a picture, at least one of the multiple light sensors is required to be configured to detect the ambient brightness above the first screen.

When the first screen is in the unfolded state, the orientation of the light sensing surface of the light sensor is the same as the orientation of the display surface of the first screen, such that the light sensor may sense the ambient brightness above the first screen. Of course, if the first screen is in the folded state, the light sensor may be shielded, such that, in the folded state, the light sensor may not be used, or the processing module does not select the alternative detection data of the light sensor as the target detection data.

Figure 2:
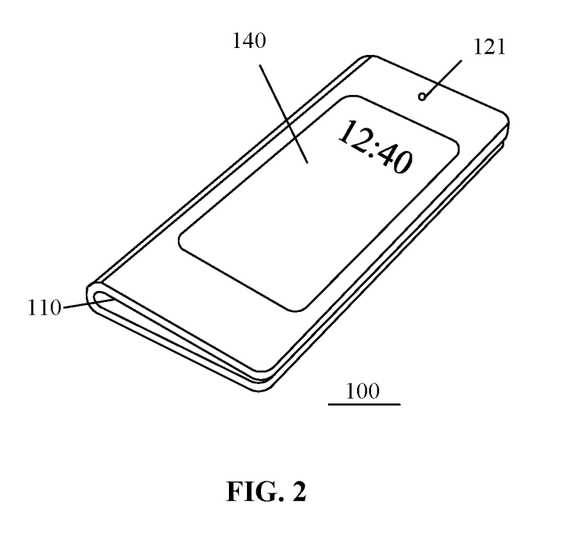
FIG. 2 is a second structure diagram of an electronic device, according to an exemplary embodiment.

In some embodiments, as illustrated in FIG. 2, the electronic device 100 further includes: a second screen 140, positioned on a back surface of the first screen 110.

The light sensing surface 121 of at least one light sensor is on the same surface with the second screen 140 and is the same as a display surface of the second screen 140 in orientation.

When the first screen of the electronic device is in the folded state, the second screen may display the picture and be used by the user. In such case, it is necessary to acquire ambient brightness above the second screen. Therefore, at least one light sensor is also arranged on the surface where the second screen is located to detect the ambient brightness above the second screen. Of course, when the first screen is in the unfolded state, the light sensor may also be adopted to detect ambient brightness on the back surface of the first screen in a specific scenario.

Therefore, when the electronic device has multiple screens, no matter which screen is used, ambient brightness at a proper position may be sensed and a display brightness level of the screen may be adjusted accordingly.

In some embodiments, the electronic device further includes: a light sensing hole, positioned on a surface, where the display surface of the second screen is located, of the electronic device and configured to expose the light sensing surface of the corresponding light sensor.

The second screen may not be a full screen and namely only occupies part of a region of a plane where it is located. In such case, the light sensor may be arranged in a region outside the second screen and exposed through the light sensing hole. Therefore, the light sensor, when sensing the ambient light, is unlikely to be interfered by brightness of the display screen, thereby processing data conveniently.

Figure 3:
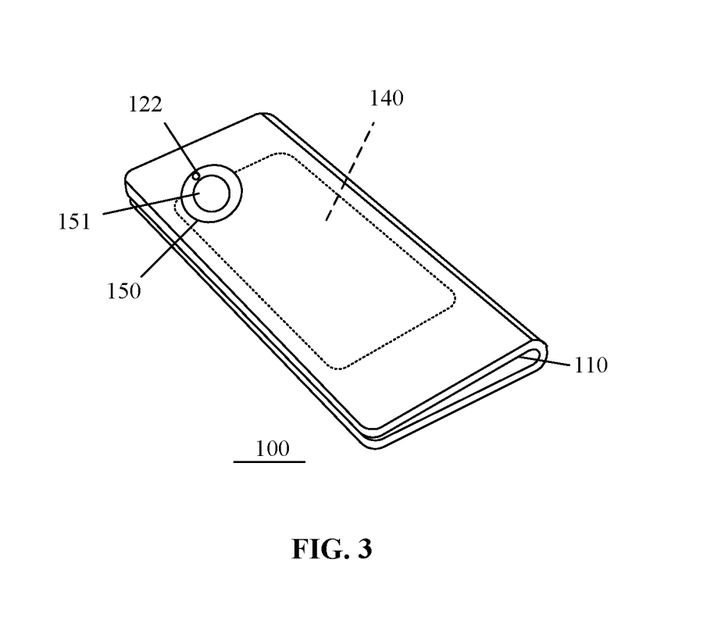
FIG. 3 is a third structure diagram of an electronic device, according to an exemplary embodiment.

In some embodiments, as illustrated in FIG. 3, the electronic device further includes: an image-pickup component 150, positioned on the back surface of the first screen 110. At least one light sensor is on the same surface with the image-pickup component 150, and the orientation of the light sensing surface 122 of the light sensor is the same as an orientation of a lens 151 of the image-pickup component 150.

When the first screen is in a folded state, the image-pickup component and the second screen are on different surfaces; the light sensor on the same surface with the image-pickup component and the light sensor on the same surface with the second screen are target light sensors.

When the first screen is in the unfolded state, the image-pickup component and the second screen are the same surface; and the light sensor on the same surface with the image-pickup component, the light sensor on the same surface with the second screen and the light sensor on the same surface with the first screen are target light sensors.

In the embodiments of the present disclosure, the electronic device may be considered to consist of two parts that may move relatively, and the first screen covers one surface of each of the two parts to form a bendable surface. On the back surface of the first screen, each of the two parts has a surface. On one surface, the image-pickup component is arranged for photographing and the like, and in addition, another component such as a flash lamp and a microphone (MIC) may also be arranged. On this surface, at least one light sensor is arranged and may be configured to sense ambient brightness on an outer side of the lens.

On the surface of the other part in the two parts of the electronic device, the second screen in the embodiment may be arranged as a secondary display screen that may be used when the first screen is in the folded state.

Therefore, when the first screen of the electronic device is in the unfolded state, there is a light sensor capable of detecting the ambient light above the first screen on one side of the first screen, and there are at least two light sensors capable of detecting the ambient light on the back surface of the first screen. Then, through the two light sensors and the light sensor facing the first screen, the ambient light in each direction in front of and behind the electronic device may be detected when the first screen is unfolded. Therefore, the processing module may determine these light sensors as target light sensors, determine the detection data thereof as alternative detection data, and then select the target detection data.

When the first screen of the electronic device is in the folded state, the light sensor of which the light sensing surface is the same as the display surface of the first screen may be shielded, and the detection data of the light sensor may not be determined as the target detection data. Therefore, the light sensor may be turned off and disabled for detection; or, the processing module does not select the shielded light sensor as the target light sensor and thus does not select the detection data of the light sensor.

In an embodiment, the processing module may select the target detection data according to a brightness value of the alternative detection data. For example, the data representing maximum ambient brightness in the alternative detection data is determined as the target detection data. Therefore, ambient light data on the side with greatest influence on the ambient light of the electronic device may be used as the target detection data.

In some embodiments, the electronic device further includes: an state detector, configured to detect an state of the first screen. The state at least includes the unfolded state and the folded state.

In the embodiments of the present disclosure, the present state of the first screen may be determined according to the display state of the first screen or the second screen, or the state of the first screen may be directly detected according to the state detector. The state detector may be an optical sensor and a magnetic sensor, and may also be an accelerometer sensor, a gyroscope sensor and the like. Relative positions of the two bendable parts, bearing the first screen, of the electronic device, are detected through the state detector, thereby determining the state of the first screen.

Herein, the state of the first screen may indicate the position, posture, or attitude of the flexible screen. For example, the state of the first screen includes the unfolded state and the folded state. In the unfolded state, a foldable part of the first screen is unfolded to a flat angle, such that the first screen is in a planar state. In the folded state, the foldable part of the first screen is folded, such that the first screen is folded and not exposed. In addition, the state of the first screen may also include folding to any angle greater than 0 degree and less than 360 degrees.

Figure 4:
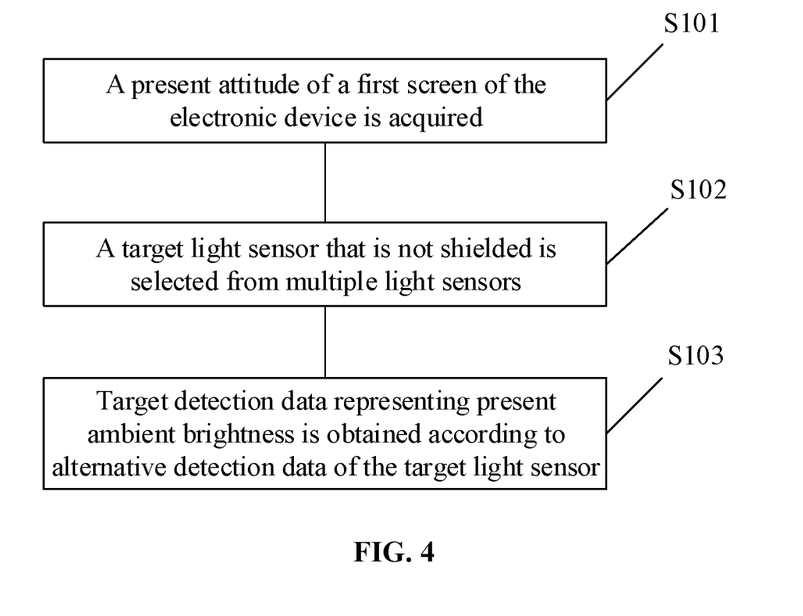
FIG. 4 is a flow chart showing a method for detecting ambient light, according to an exemplary embodiment.

The embodiments of the present disclosure also provide a method for detecting ambient light. As illustrated in FIG. 4, the method is applied to the electronic device in any above-mentioned embodiment and includes operations as follows.

At S101, a present state of a first screen of the electronic device is acquired.

At S102, a target light sensor that is not shielded is selected from multiple light sensors.

At S103, target detection data representing present ambient brightness is obtained according to alternative detection data of the target light sensor. The alternative detection data may include detection data sensed by the target light sensor.

In the embodiments of the present disclosure, by use of any abovementioned electronic device, ambient light may be detected by adopting the method in the embodiment. The premise is that the present state of the first screen of the electronic device is acquired and data detected by corresponding light sensors that are not shielded is selected as the finally used target detection data under different states.

The target detection data may be configured to represent ambient brightness of an environment where the electronic device is located, may be applied to an application program of the electronic device, and may also be applied to adjustment of a display brightness level of the first screen or another screen of the electronic device.

Since brightness detected by light sensors at different positions may be different, required alternative detection data may be determined as the target detection data according to the present state. For example, when the electronic device is in an unfolded state, alternative detection data detected by a light sensor detecting ambient brightness above the first screen is determined as the target detection data; and when the electronic device is in a folded state, alternative detection data detected by a light sensor on a back surface of the first screen is determined as the target detection data.

In such a manner, for the electronic device with the foldable flexible screen, the ambient brightness may be detected when the first screen is in different states, and even though a light sensor is shielded after the first screen is folded, detection data of another light sensor may be adopted, such that the ambient light detection accuracy and flexibility are improved.

In some embodiments, the operation that the target detection data representing the present ambient brightness is selected from alternative detection data sensed by the light sensors at different positions according to the present state includes that: when the present state is an unfolded state, at least the light sensor of which a light sensing surface is the same as a display surface of the first screen in orientation is determined as the target light sensor; when the present state is a folded state, at least one light sensor of which a light sensing surface is different from a display surface of the first screen in orientation is determined as the target light sensor;

and the target detection data is determined according to a value of the alternative detection data detected by the target light sensor.

When the first screen is in the unfolded state, all the light sensors may be exposed and not shielded and thus may be configured to detect the ambient brightness. Therefore, all the light sensors may be determined as target light sensors, and detection data thereof may be determined as alternative detection data. Since the first screen, when being unfolded, is usually in a state of facing a user, it is important to detect the ambient brightness above the first screen. Therefore, it is at least necessary to determine the light sensor detecting the ambient brightness above the first screen as the target light sensor and determine the detection data thereof as the alternative detection data.

When the first screen is in the folded state, the light sensor configured to detect the ambient brightness above the first screen may be shielded. In such case, the shielded light sensor may not be determined as the target light sensor, and the detection data thereof is also not required to be determined as the alternative detection data, such that the data processing load is reduced.

The alternative detection data of different target light sensors may be determined based on different states, and then the target detection data may further be selected according to a practical requirement. For example, the target detection data is selected according to the brightness value of the alternative detection data, or the target detection data is selected according to a requirement of a target application program corresponding to the target detection data.

In some embodiments, the operation that the present state of the electronic device is acquired includes that: if the first screen is presently in a display state, it is determined that the present state is the unfolded state; and if the first screen is presently in an off state and a second screen is in the display state, it is determined that the present state is the folded state.

If the first screen of the electronic device only includes two states (such as the folded state and the unfolded state), the present state of the first screen may be determined according to a display state of a display screen of the electronic device, and the display screen includes the first screen and the second screen. If the first screen is displaying a picture, it is indicated that the first screen is being used and thus is not folded, such that it may be determined that the present state is the unfolded state.

If the first screen does not display any picture and the second screen is displaying a picture, it is indicated that the second screen is being used, such that it may be determined that the first screen is in the folded state.

In some embodiments, the operation that the present state of the electronic device is acquired may further include that: the present state detected by an state detector is acquired. The present state at least includes the unfolded state and the folded state.

Of course, besides the folded state and the unfolded state, the state of the first screen further includes a state of folding to any angle greater than 0 degree and less than 360 degrees, and the present state may not be determined accurately in a manner of judging the state according to the display states of the first screen and the second screen. In such case, a relative position relationship between two parts, which may move relatively, of the electronic device may also be detected according to the state detector arranged in the electronic device, so as to further determine the state of the first screen. For example, state detection is implemented through a sensor such as an optical sensor, a magnetic sensor, an accelerometer sensor, a gyroscope sensor, and the like.

In some embodiments, the method further includes that: when the first screen is in the display state, a display brightness level of the first screen is determined; and detection data of the light sensor in the first screen is compensated according to a preset compensation parameter corresponding to the display brightness level, the compensated alternative detection data is obtained.

Herein, if the first screen is a full screen, the light sensor configured to detect the ambient brightness above the first screen is required to be arranged in the first screen for use as an in-screen sensor. During detection, the in-screen sensor is likely to be interfered by display brightness of the first screen, and thus it is difficult to detect the ambient brightness accurately.

Therefore, the in-screen sensor is required to be tested or trained massively before delivery to determine detection errors of the in-screen sensor under different display brightness levels of the first screen and to determine corresponding compensation parameters.

In a using process, the corresponding preset compensation parameter may be called according to the display brightness level of the first screen to compensate the detection parameter, and the available alternative detection data of the light sensor is obtained.

Of course, if the light sensor is outside the display screen and the light sensing surface is exposed through a light sensing hole formed in a housing of the electronic device, it is unlikely to be interfered by the brightness of the display screen, such that the detection data is not required to be compensated and may be directly determined as the alternative detection data.

Through the technical solution in the embodiments of the present disclosure, the multiple light sensors facing different directions are arranged at different positions of the electronic device, such that light in different directions in an environment where the electronic device is located may be detected, and the flexibility in ambient light detection is improved. In addition, with adoption of the solutions, the electronic device may select the light sensor that is not shielded as the target light sensor when the flexible screen is in different states and may select accurate detection data as the target detection data, such that the accuracy of ambient light detection under different states is improved.

The embodiments of the present disclosure also provide the following example.

Figure 5:
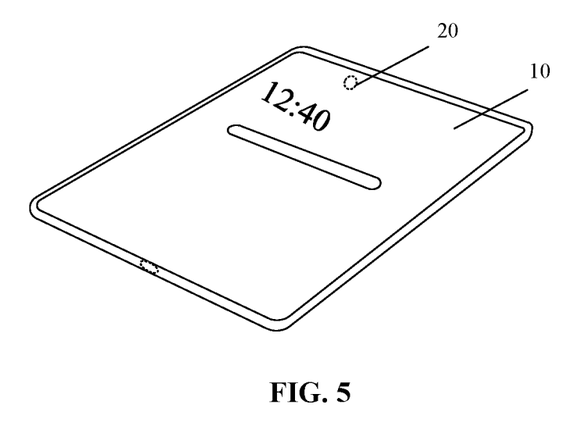
FIG. 5 is a fourth structure diagram of an electronic device, according to an exemplary embodiment.

For an electronic device with a foldable flexible screen, as illustrated in FIG. 5, the flexible screen, as a main screen 10, may be folded or unfolded to a plane along with changing of an state of the electronic device, and may also be folded to any angle between 0 and 360 degrees. A light sensor 20 is arranged on one side of the main screen, and a design solution of an in-screen light sensor may be adopted. A secondary screen is arranged on a back surface of the main screen. The secondary screen may not be a full screen, and a light sensor on one side of the secondary screen is arranged below cover glass of the secondary screen.

Through an accelerometer sensor and gyroscope sensor-based detection method or a magnetic detection method, an state of the flexible screen may be detected. For different states, different light sensors may be called to further implement omnidirectional accurate positioning detection.

When the flexible screen is in an unfolded state, the light sensor is in the flexible screen and may detect ambient brightness above the flexible screen. The light sensor on one side of the secondary screen may detect ambient brightness of a back surface of the electronic device.

When the flexible screen is in a folded state, the secondary screen faces up for a user to view. In such case, the light sensor on one side of the secondary screen may detect ambient brightness above the secondary screen. In addition, a light sensor may also be arranged below the back surface of the electronic device and positioned nearby an image-pickup component of the electronic device, for example, arranged at a position adjacent to a lens or below cover glass of the lens. The light sensor may detect the ambient brightness on the back surface of the electronic device.

With adoption of the design, no matter whether a usage state of the electronic device is the folded state or the unfolded state, the ambient brightness above (on the side facing the user) and below (on the side back on to the user) of the electronic device may be detected. In an ordinary application scenario, ambient brightness data above the electronic device may be used. In some special scenarios, for example, a night outdoor scenario, there is a floor lamp with relatively high brightness on the ground or a lamp of a vehicle irradiates the electronic device from the opposite side. In such case, the conditions that the user is unlikely to view the electronic device clearly and is dazzled and the like are likely to occur due to such light. Therefore, data detected below the electronic device may be determined as ambient light data, and the data is further adopted to adjust a display brightness level of the display screen.

In the embodiments of the present disclosure, the electronic device has at least three light sensors. These light sensors may be electronically connected to a processor through the same inter-integrated circuit (I2C) communication line or different I2C communication lines. However, the light sensors are required to have different addresses, identifiers, or the like, for the processor to determine the specific light sensor of which detection data is to be used.

For the light sensor in the flexible screen, it is necessary to consider interference of display brightness of the flexible screen to the detection data, such that the detection data is required to be compensated under different display brightness levels to obtain real ambient brightness data.

When it is determined in a screen state detection manner based on the accelerometer sensor and the gyroscope sensor, a magnetic manner or another manner that the flexible screen is in the folded state and the secondary screen faces up and is in an interaction state, if the light sensor below the cover glass above the secondary screen is called to detect the ambient brightness or the light sensor at the position adjacent to the image-pickup component is adopted to detect the ambient brightness, since these light sensors only detect external ambient light, it is unnecessary to consider the influence of the brightness of the display screen, and furthermore, it is only necessary to convert a detected value to a value of a light intensity unit through a certain mathematical model to adjust the display brightness level of the display screen.

Through the technical solution in the embodiments of the present disclosure, multiple light sensors are arranged at different positions of the electronic device with the foldable flexible screen, and ambient brightness in multiple directions may be detected. The ambient brightness at proper positions may be conveniently detected when the flexible screen is in different states, and the display brightness level of the display screen may further be correspondingly adjusted, thereby improving user experience.

Figure 6:
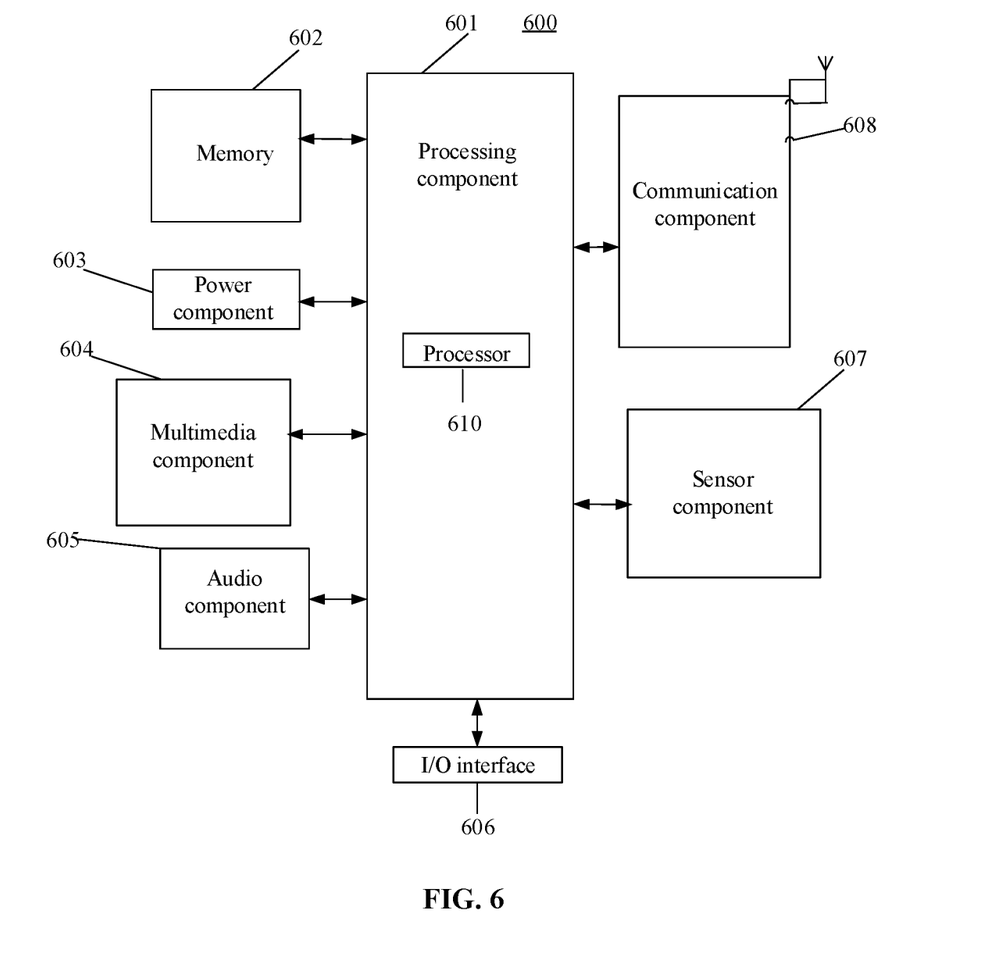
FIG. 6 is a block diagram showing a physical structure of an electronic device, according to an exemplary embodiment.

FIG. 6 is a block diagram showing a physical structure of an electronic device 600, according to an exemplary embodiment. For example, the electronic device 600 may be a mobile phone, a computer, a digital broadcast terminal, a messaging device, a gaming console, a tablet, a medical device, exercise equipment, a personal digital assistant, and the like.

Referring to FIG. 6, the electronic device 600 may include one or more of the following components: a processing component 601, a memory 602, a power component 603, a multimedia component 604, an audio component 605, an input/output (I/O) interface 606, a sensor component 607, and a communication component 608.

The processing component 601 typically controls overall operations of the electronic device 600, such as the operations associated with display, telephone calls, data communications, camera operations, and recording operations. The processing component 601 may include one or more processors 610 to execute instructions to perform all or part of the steps in the abovementioned method. Moreover, the processing component 601 may include one or more modules which facilitate interaction between the processing component 601 and other components. For instance, the processing component 601 may include a multimedia module to facilitate interaction between the multimedia component 604 and the processing component 601.

The memory 602 is configured to store various types of data to support the operation of the electronic device 600. Examples of such data include instructions for any applications or methods operated on the electronic device 600, contact data, phonebook data, messages, pictures, video, etc. The memory 602 may be implemented by any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, and a magnetic or optical disk.

The power component 603 provides power for various components of the electronic device 600. The power component 603 may include a power management system, one or more power supplies, and other components associated with generation, management and distribution of power for the electronic device 600.

The multimedia component 604 includes a screen providing an output interface between the electronic device 600 and a user. In some embodiments, the screen may include a liquid crystal display (LCD) and a touch panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also detect a period of time and a pressure associated with the touch or swipe action. In some embodiments, the multimedia component 604 includes a front camera and/or a rear camera. The front camera and/or the rear camera may receive external multimedia data when the electronic device 600 is in an operation mode, such as a photographing mode or a video mode. Each of the front camera and/or the rear camera may be a fixed optical lens system or have focusing and optical zooming capabilities.

The audio component 605 is configured to output and/or input an audio signal. For example, the audio component 605 includes a microphone (MIC), and the MIC is configured to receive an external audio signal when the electronic device 600 is in an operation mode, such as a call mode, a recording mode and a voice recognition mode. The received audio signal may further be stored in the memory 602 or sent through the communication component 608. In some embodiments, the audio component 605 further includes a speaker configured to output the audio signal.

The I/O interface 606 provides an interface between the processing component 601 and peripheral interface modules, such as a keyboard, a click wheel, buttons, and the like. The buttons may include, but are not limited to: a home button, a volume button, a starting button and a locking button.

The sensor component 607 includes one or more sensors configured to provide status assessments in various aspects for the electronic device 600. For instance, the sensor component 607 may detect an on/off status of the electronic device 600 and relative positioning of components, such as a display and small keyboard of the electronic device 600, and the sensor component 607 may further detect a change in a position of the electronic device 600 or a component of the electronic device 600, presence or absence of contact between the user and the electronic device 600, orientation or acceleration/deceleration of the electronic device 600 and a change in temperature of the electronic device 600. The sensor component 607 may include a proximity sensor configured to detect presence of an object nearby without any physical contact. The sensor component 607 may also include a light sensor, such as a complementary metal oxide semiconductor (CMOS) or charge coupled device (CCD) image sensor, configured for use in an imaging application. In some embodiments, the sensor component 607 may also include an acceleration sensor, a gyroscope sensor, a magnetic sensor, a pressure sensor or a temperature sensor.

The communication component 608 is configured to facilitate wired or wireless communication between the electronic device 600 and other devices. The electronic device 600 may access a communication-standard-based wireless network, such as a wireless fidelity (WiFi) network, a 2nd-generation (2G) or 3rd-generation (3G) network or a combination thereof. In an exemplary embodiment, the communication component 608 receives a broadcast signal or broadcast associated information from an external broadcast management system through a broadcast channel. In an exemplary embodiment, the communication component 608 further includes a near field communication (NFC) module to facilitate short-range communications. For example, the NFC module may be implemented based on a radio frequency identification (RFID) technology, an infrared data association (IrDA) technology, an ultra-wide band (UWB) technology, a Bluetooth (BT) technology or other technologies.

In an exemplary embodiment, the electronic device 600 may be implemented by one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors or other electronic components, and is configured to execute the abovementioned method.

In an exemplary embodiment, there is also provided a non-transitory computer-readable storage medium including instructions, such as included in the memory 602, executable by the processor 610 of the electronic device 600 for performing the abovementioned methods. For example, the non-transitory computer-readable storage medium may be a ROM, a random access memory (RAM), a compact disc read-only memory (CD-ROM), a magnetic tape, a floppy disc, an optical data storage device, and the like.

According to a non-transitory computer-readable storage medium, instructions in the storage medium are executed by a processor of a mobile terminal to cause the mobile terminal to execute any method in the abovementioned embodiments.

Other implementation solutions of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. An electronic device, comprising:
   a first screen comprising a foldable flexible screen;
   multiple light sensors having light sensing surfaces with different orientations;
   at least one processor, electronically connected respectively with the first screen and the light sensors and configured to select a target light sensor from the multiple light sensors according to a present state of the first screen and obtain target detection data representing present ambient brightness according to detection data of the target light sensory;
   a second screen, positioned on a back surface of the first screen; wherein the light sensing surface of at least one light sensor is on a same surface with the second screen, and the orientations of the light sensing surface of the at least one light sensor and a display surface of the second screen are identical; and
   an image-pickup component, positioned on a back surface of the first screen;
   wherein at least one light sensor is on a same surface with the image-pickup component, and the orientations of the light sensing surface of the light sensor and a lens of the image-pickup component are identical;
   wherein the image-pickup component and the second screen are on different surfaces in response to the first screen in a folded state; and the light sensor on the same surface with the image-pickup component and the light sensor on the same surface with the second screen are target light sensors; and
   wherein the image-pickup component and the second screen are on a same surface in response to the first screen in an unfolded state; and the light sensor on the same surface with the image-pickup component, the light sensor on the same surface with the second screen and the light sensor on a same surface with the first screen are target light sensors.

2. The electronic device of claim 1, wherein at least one light sensor is on a same surface with the first screen, and the orientations of the light sensing surface of the at least one light sensor and a display surface of the first screen in the unfolded state are identical, wherein the first screen in the unfolded state is unfolded to a plane.

3. The electronic device of claim 1, further comprising:
   a light sensing hole, positioned on a surface, where the display surface of the second screen is located, of the electronic device and configured to expose the light sensing surface of the corresponding light sensor.

4. The electronic device of claim 1, further comprising:
a state detector, configured to detect a state of the first screen, wherein the state at least comprises the unfolded state and the folded state.

5. A method for detecting ambient light, applied to an electronic device, comprising:
acquiring a present state of a first screen of the electronic device;
selecting a target light sensor from multiple light sensors according to the present state of the first screen; and
obtaining target detection data representing present ambient brightness according to detection data of the target light sensor,
wherein selecting the target light sensor from the multiple light sensors according to the present state of the first screen comprises:
determining, in response to the first screen in a folded state, a light sensor on a same surface with an image-pickup component positioned on a back surface of the first screen, and a light sensor on a same surface with a second screen positioned on a back surface of the first screen as the target light sensor, wherein the image-pickup component and the second screen are on different surfaces in response to the first screen in the folded state; and
determining, in response to the first screen in an unfolded state, the light sensor on the same surface with the image-pickup component, the light sensor on the same surface with the second screen and the light sensor on a same surface with the first screen as the target light sensor, wherein the image-pickup component and the second screen are on a same surface in response to the first screen in the unfolded state.

6. The method of claim 5, wherein selecting the target detection data representing the present ambient brightness from detection data sensed by the light sensors at different positions according to the present state comprises:
determining the target detection data according to a value of the detection data detected by the target light sensor.

7. The method of claim 5, wherein acquiring the present state of the electronic device comprises:
determining, in response to the first screen presently in a display state, that the present state is the unfolded state; and
determining, in response to the first screen presently in an off state and a second screen in the display state, that the present state is the folded state.

8. The method of claim 5, wherein acquiring the present state of the electronic device comprises:
acquiring the present state detected by a state detector, wherein the present state at least comprises the unfolded state and the folded state.

9. The method of claim 5, further comprising:
determining, in response to the first screen in a display state, a display brightness level of the first screen; and
compensating detection data of the light sensor in the first screen according to a preset compensation parameter corresponding to the display brightness level, and obtaining compensated detection data.

10. A device for detecting ambient light, at least comprising a processor and a memory configured to store executable instructions run in the processor,
wherein the processor is configured to run the executable instructions to execute the steps in the method for detecting ambient light of claim 7.

11. A non-transitory computer-readable storage medium, in which computer-executable instructions are stored, the computer-executable instructions being executed by a processor to implement a method for detecting ambient light, applied to an electronic device, comprising:
acquiring a present state of a first screen of the electronic device;
selecting a target light sensor from multiple light sensors according to the present state of the first screen; and
obtaining target detection data representing present ambient brightness according to detection data of the target light sensor,
wherein selecting the target light sensor from the multiple light sensors according to the present state of the first screen comprises:
determining, in response to the first screen in a folded state, a light sensor on a same surface with an image-pickup component positioned on a back surface of the first screen, and a light sensor on a same surface with a second screen positioned on a back surface of the first screen as the target light sensor, wherein the image-pickup component and the second screen are on different surfaces in response to the first screen in the folded state; and
determining, in response to the first screen in an unfolded state, the light sensor on the same surface with the image-pickup component, the light sensor on the same surface with the second screen and the light sensor on a same surface with the first screen as the target light sensor, wherein the image-pickup component and the second screen are on a same surface in response to the first screen in the unfolded state.

12. The non-transitory computer-readable storage medium of claim 11, wherein selecting the target detection data representing the present ambient brightness from detection data sensed by the light sensors at different positions according to the present state comprises:
determining the target detection data according to a value of the detection data detected by the target light sensor.

13. The non-transitory computer-readable storage medium of claim 11, wherein acquiring the present state of the electronic device comprises:
determining, in response to the first screen presently in a display state, that the present state is the unfolded state; and
determining, in response to the first screen presently in an off state and a second screen in the display state, that the present state is the folded state.

14. The non-transitory computer-readable storage medium of claim 11, wherein acquiring the present state of the electronic device comprises:
acquiring the present state detected by a state detector, wherein the present state at least comprises the unfolded state and the folded state.

15. The non-transitory computer-readable storage medium of claim 11, further comprising:
determining, in response to the first screen in a display state, a display brightness level of the first screen; and
compensating detection data of the light sensor in the first screen according to a preset compensation parameter corresponding to the display brightness level, and obtaining compensated detection data.

* * * * *